United States Patent
Jiang et al.

(10) Patent No.: US 12,034,106 B2
(45) Date of Patent: Jul. 9, 2024

(54) FLEXIBLE DISPLAY PANEL

(71) Applicant: AU Optronics Corporation, Hsin-Chu (TW)

(72) Inventors: Cheng-Wei Jiang, Hsin-Chu (TW); Yi-Da He, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 448 days.

(21) Appl. No.: 17/464,729

(22) Filed: Sep. 2, 2021

(65) Prior Publication Data
US 2022/0399484 A1     Dec. 15, 2022

(30) Foreign Application Priority Data

Jun. 11, 2021   (TW) ................................. 110121560

(51) Int. Cl.
| | |
|---|---|
| *H01L 33/62* | (2010.01) |
| *G09F 9/30* | (2006.01) |
| *G09F 9/33* | (2006.01) |
| *H01L 27/15* | (2006.01) |
| *H01L 33/12* | (2010.01) |

(52) U.S. Cl.
CPC ............. *H01L 33/62* (2013.01); *G09F 9/301* (2013.01); *G09F 9/33* (2013.01); *H01L 27/156* (2013.01); *H01L 33/12* (2013.01)

(58) Field of Classification Search
CPC ..... H01L 33/62; H01L 33/12; H01L 25/0753; G09F 9/301; G09F 9/33; H10K 59/12; H10K 59/131
See application file for complete search history.

(56) References Cited

U.S. PATENT DOCUMENTS

| | | |
|---|---|---|
| 2018/0046221 A1 | 2/2018 | Choi et al. |
| 2019/0019966 A1 | 1/2019 | Jiang et al. |
| 2019/0107911 A1* | 4/2019 | Zhai ........................ H10K 59/40 |
| 2019/0258297 A1 | 8/2019 | Choi et al. |
| 2020/0243778 A1 | 7/2020 | Li |
| 2020/0328269 A1* | 10/2020 | Shin ........................ H10K 50/80 |

(Continued)

FOREIGN PATENT DOCUMENTS

| | | |
|---|---|---|
| CN | 109830614 A | 5/2019 |
| CN | 111564482 A | 8/2020 |

(Continued)

*Primary Examiner* — Victor A Mandala
(74) *Attorney, Agent, or Firm* — WPAT, P.C

(57) ABSTRACT

The present disclosure provides a flexible display panel, which includes a substrate, a plurality of hollow regions, a plurality of display units, a plurality of wire structures, and a plurality of spacers. The substrate is defined as a plurality of island regions and a plurality of bridge regions. Each of the hollow regions is surrounded by four adjacent of the island regions and four adjacent of the bridge regions. The display units are respectively disposed on the island regions of the substrate. The wire structures are respectively disposed on the bridge regions and electrically connected to the display units. Each of the wire structures includes at least one wire layer including at least one wire disposed on the substrate. The spacers are disposed on and in contact with the substrate, and respectively surround the hollow regions, and separated from the wire structures to control etching sizing.

13 Claims, 10 Drawing Sheets

(56) References Cited

U.S. PATENT DOCUMENTS

| | | | |
|---|---|---|---|
| 2020/0409419 A1 | 12/2020 | He et al. | |
| 2021/0049939 A1 | 2/2021 | Sui et al. | |
| 2021/0193774 A1* | 6/2021 | Won | H10K 59/128 |
| 2021/0208446 A1 | 7/2021 | Yang et al. | |
| 2021/0225984 A1* | 7/2021 | Wang | H10K 59/35 |
| 2022/0328593 A1* | 10/2022 | Song | H10K 50/16 |
| 2022/0344612 A1* | 10/2022 | Jia | H10K 77/111 |

FOREIGN PATENT DOCUMENTS

| | | |
|---|---|---|
| CN | 111584537 A | 8/2020 |
| CN | 112258994 A | 1/2021 |
| CN | 107808896 B | 2/2021 |
| CN | 112863340 A | 5/2021 |
| WO | WO2020/113457 A1 | 6/2020 |

\* cited by examiner

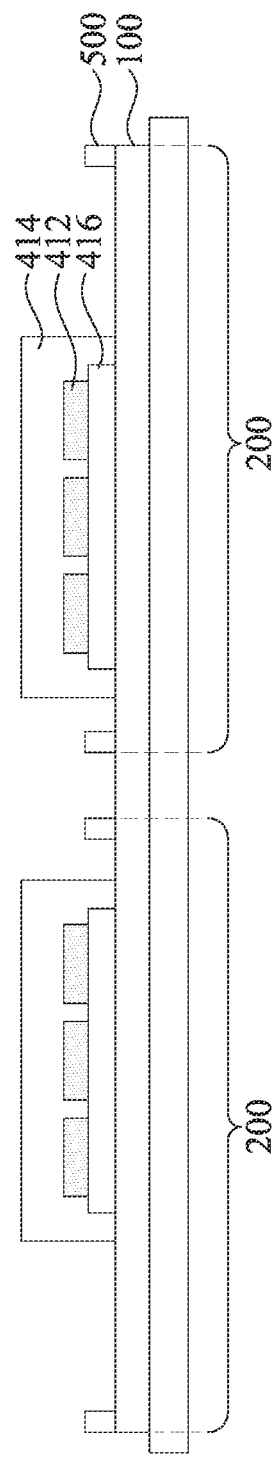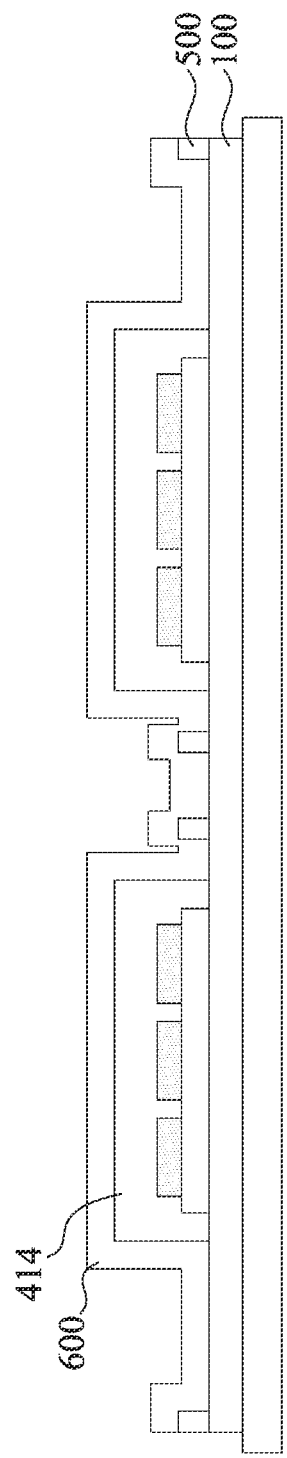

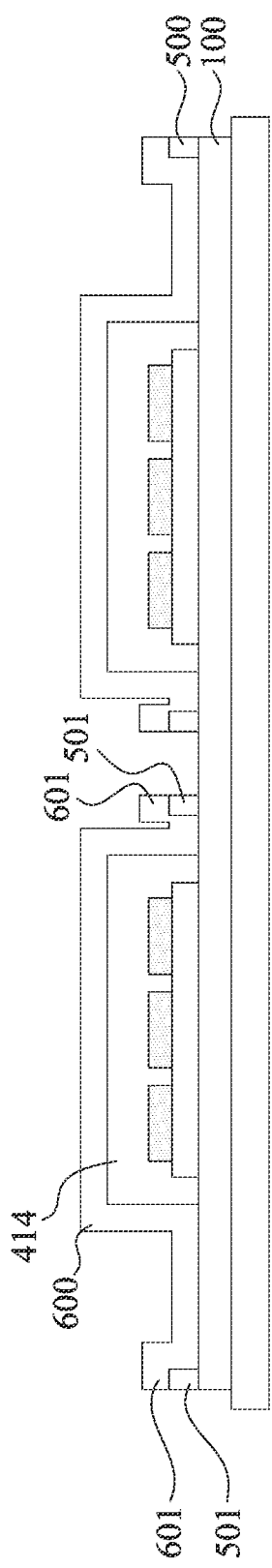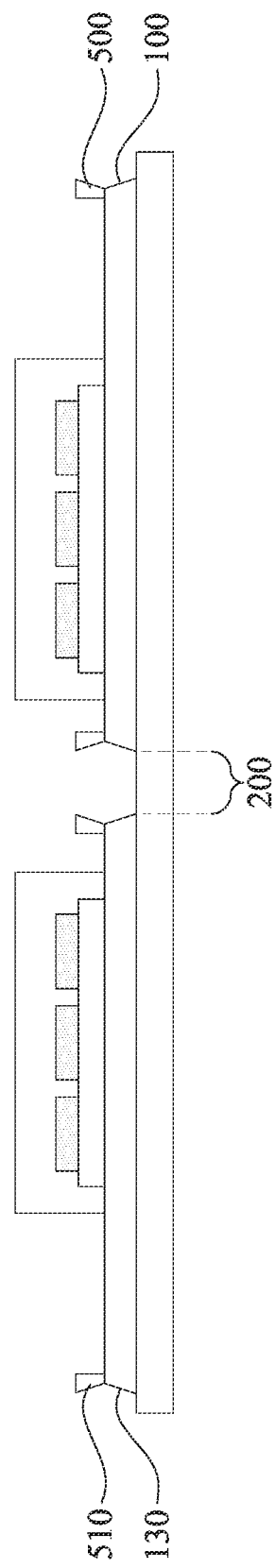

FLEXIBLE DISPLAY PANEL

CROSS-REFERENCE TO RELATED APPLICATION

This application claims priority to Taiwan Application Ser. No. 110121560, filed on Jun. 11, 2021, which is herein incorporated by reference.

BACKGROUND

Field of Invention

The present disclosure relates to a display panel, and particularly relates to a flexible display panel.

Description of Related Art

With the rapid development of electronic technology, electronic products continue to introduce new ones. In recent years, due to the limitation of the size and the structure of electronic devices, flexible and bendable display panels have gradually attracted people's attention.

However, when the display panel is in a stretched state, the display panel may be broken due to the stress generated by bending. If the stress is too large, it is more likely to cause internal circuit breakage in severe cases. Therefore, how to make the display panel provide structural stability and bendability when facing bending stress, the related art really needs to be improved.

SUMMARY

Some embodiments of the present disclosure provides a flexible display panel, which includes a substrate, a plurality of hollow regions, a plurality of display units, a plurality of wire structures, and a plurality of spacers. The substrate includes a first surface and is defined as a plurality of island regions separated from each other and a plurality of bridge regions respectively connected to two adjacent of the plurality of island regions. Each of the plurality of hollow regions is surrounded by four adjacent of the plurality of island regions and four adjacent of the plurality of bridge regions. The plurality of display units are respectively disposed on the plurality of island regions of the substrate. The plurality of wire structures are respectively disposed on the plurality of bridge regions of the substrate and electrically connected to the plurality of display units. Each of the plurality of wire structures includes at least one wire layer including at least one wire disposed on the first surface of the substrate. The plurality of spacers are disposed on and in contact with the substrate, and respectively surround the plurality of hollow regions, and separated from the plurality of wire structures.

In some embodiments, the wire layer further includes a buffer layer disposed on the first surface of the substrate, and the at least one wire is disposed on the buffer layer, in which the buffer layer and the plurality of spacers are separated from each other.

In some embodiments, each of the plurality of wire structures further includes a protective layer covering the at least one wire, the buffer layer and a portion of the substrate.

In some embodiments, the substrate is a flexible substrate, and the plurality of spacers and the buffer layer are made of a same material.

In some embodiments, the plurality of spacers are made of an inorganic material.

In some embodiments, a bottom corner of each of the plurality of spacers adjacent to each of the plurality of hollow regions is an obtuse angle.

In some embodiments, the plurality of hollow regions are composed of a plurality of first hollow regions and a plurality of second hollow regions, in which each of the plurality of first hollow regions extends along a first direction, and each of the plurality of second hollow regions extends along a second direction, and the first direction is perpendicular to the second direction; the plurality of first hollow regions and the plurality of second hollow regions are alternately arranged along the first direction and along the second direction.

In some embodiments, each of the plurality of first hollow regions has two opposite first arc regions and two opposite first sides, and the first arc regions are respectively disposed at two ends of each of the plurality of first hollow regions along the first direction, and the first sides are respectively disposed between the first arc regions. A distance between each of the plurality of spacers adjacent to the first sides of each of the plurality of first hollow regions and each of the plurality of wire structures is smaller than a distance between each of the plurality of spacers adjacent to the first arc regions of each of the plurality of first hollow regions and each of the plurality of wire structures.

In some embodiments, each of the plurality of second hollow regions has two opposite second arc regions and two opposite second sides, and the second arc regions are respectively disposed at two ends of each of the plurality of second hollow regions along the second direction, and the second sides are respectively disposed between the second arc regions. A distance between each of the plurality of spacers adjacent to the second sides of each of the plurality of second hollow regions and each of the plurality of wire structures is smaller than a distance between each of the plurality of spacers adjacent to the second arc regions of each of the plurality of second hollow regions and each of the plurality of wire structures.

In some embodiments, a number of the wire layer is a plurality of wire layers, and the plurality of wire layers are stacked in sequence.

In some embodiments, each of the plurality of wire layers further includes a buffer layer and a protective layer, and the at least one wire of each of the plurality of wire layers is respectively disposed on each of the buffer layers, and each of the protective layers respectively covers the at least one wire and each of the buffer layers of each of the plurality of wire layers. The buffer layer disposed on the first surface of the substrate and the plurality of spacers are separated from each other.

In some embodiments, the substrate is a flexible substrate, and the plurality of spacers and one of the buffer layers of the plurality of wire layers are made of a same material.

In some embodiments, each of the plurality of wire structures further includes at least one thin film transistor electrically connected to the at least one wire.

In some embodiments, a number of the wire is a plurality of wires, and the plurality of wires are disposed on the first surface of the substrate at intervals in sequence.

In some embodiments, the display unit includes a light emitting diode chip.

BRIEF DESCRIPTION OF THE DRAWINGS

Various aspects of the present disclosure will be most easily understood when the following detailed description is read in conjunction with the accompanying drawings. It should be noted that according to industry standard operating procedures, various characteristic structures may not be drawn to scale. In fact, for clarity of discussion, the size of various characteristic structures may be arbitrarily increased or decreased. In order to make the above and other objectives, features, advantages and embodiments of the present invention easier to understand, the accompanying drawings are described as follows:

FIG. 9 to FIG. 13 are schematic cross-sectional views of a method of manufacturing a flexible display panel at various stages according to some embodiments of the present disclosure.

DETAILED DESCRIPTION

Figure 1:
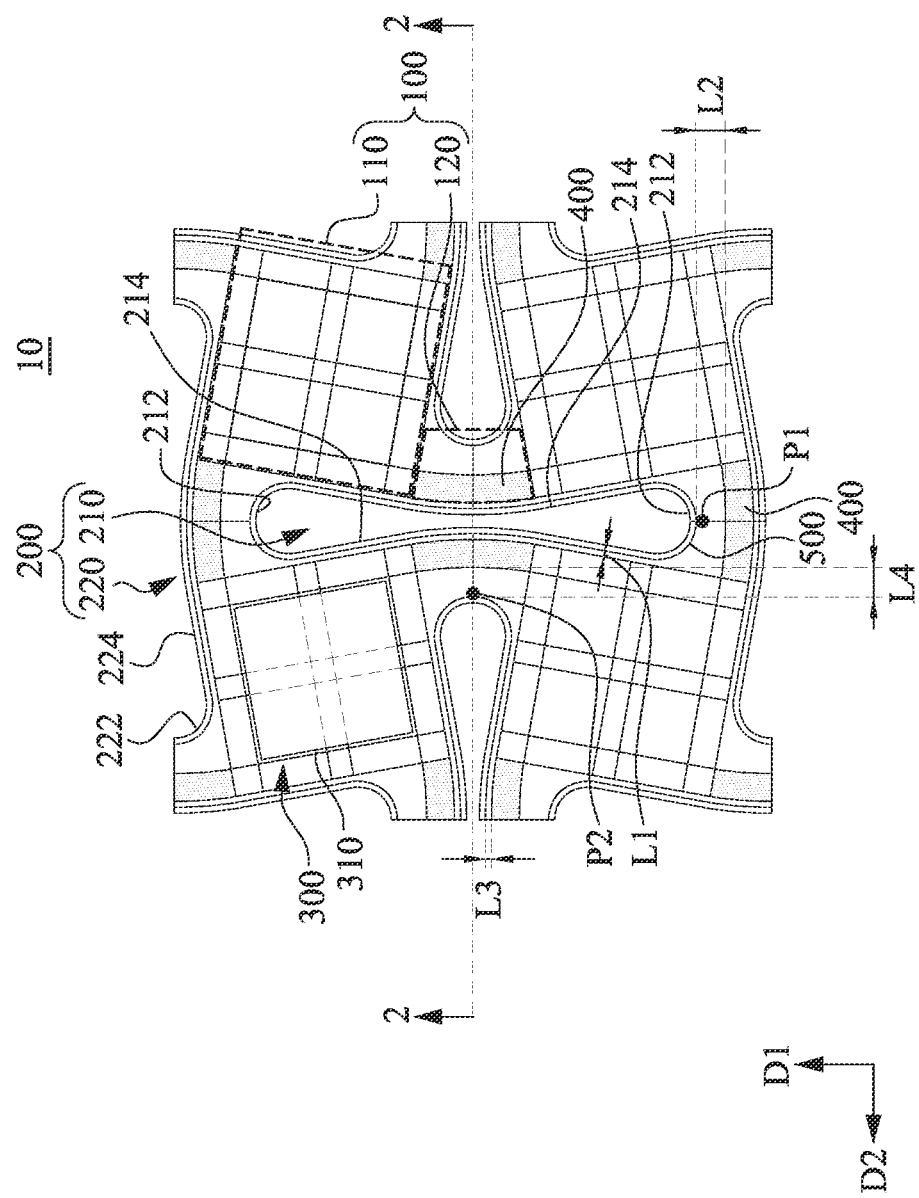
FIG. 1 is a top view of a flexible display panel according to some embodiments of the disclosure.

In the drawings, the thickness of layers, films, panels, regions, etc., are exaggerated for clarity. Throughout the specification, the same reference numerals denote the same elements. It should be understood that when an element such as a layer, film, region, or substrate is referred to as being "on" or "connected" to another element, it can be directly on or connected to the other element, or an intermediate element may also be present. In contrast, when an element is referred to as being "directly on" or "directly connected to" another element, there is no intermediate element. As used herein, "connected to" can refer to physical and/or electrical connection. Furthermore, "electrically connected to" or "coupled to" means that there may be another element between two elements.

As used herein, the term "about", "approximately", or "substantially" includes a stated value and an average value within an acceptable deviation range of a specific value determined by a person of ordinary skill in the art, taking into account the discussed measurement and the specific number of errors associated with the measurement (i.e., the limitation of the measurement system). For example, "about" can mean the stated value is within one or more standard deviations, such as within ±30%, ±20%, ±10%, ±5%. Furthermore, the term "about", "approximate" or "substantially" used herein can be based on optical properties, etching properties or other properties to select a more acceptable deviation range or standard deviation, and thus there may be more than one standard deviation for all properties.

Unless otherwise defined, all terms (including technical and scientific terms) used herein have the same meaning as commonly understood by those of ordinary skill in the art of the present invention. It will be further understood that terms such as those defined in commonly used dictionaries should be interpreted as having meanings consistent with their meanings in the related technologies and the context of the present invention, and will not be interpreted as idealized meaning or an overly formal meaning, unless explicitly defined as such in this article.

Figure 2:
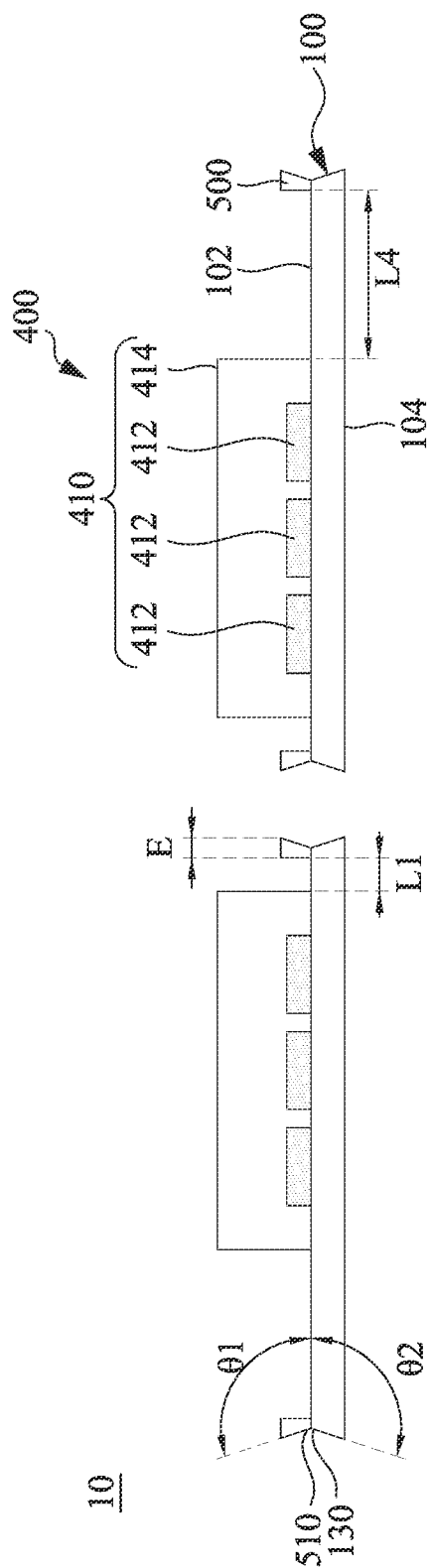
FIG. 2 is a cross-sectional view of FIG. 1 along the line 2-2.

Please refer to FIGS. 1 and 2. FIG. 1 is a top view of a flexible display panel according to some embodiments of the disclosure, and FIG. 2 is a cross-sectional view of FIG. 1 along the line 2-2. FIG. 1 only illustrates a portion of a flexible display panel 10, and other regions are arranged in a similar manner and thus are not shown. The flexible display panel 10 includes a substrate 100, a plurality of hollow regions 200, a plurality of display units 300, a plurality of wire structures 400, and a plurality of spacers 500.

The substrate 100 is a flexible substrate with elasticity and ductility. In other words, the substrate 100 can be stretched. In some embodiments, a material of the substrate 100 includes, but is not limited to, polyimide (PI), polyethylene naphthalate (PEN), and polyethylene terephthalate (PET), polycarbonates (PC), polyether sulfone (PES), polyarylate, or a combination thereof.

The substrate 100 includes a first surface 102 and a second surface 104 opposite to the first surface 102. Specifically, the first surface 102 is an upward side, and the second surface 104 is a downward side. The substrate 100 is defined as a plurality of island regions 110 and a plurality of bridge regions 120. The island regions 110 are separated from each other, and the bridge region 120 connects two adjacent of the island regions 110. In some embodiments, the island regions 110 are distributed in an array.

The hollow region 200 is surrounded by four adjacent island regions 110 and four adjacent bridge regions 120. It can also be understood that a plurality of portions of the substrate 100 are removed, and therefore, a plurality of grooves are formed on the substrate 100, that is, the hollow region 200 is formed. The hollow region 200 is composed of a plurality of first hollow regions 210 and a plurality of second hollow regions 220, in which the first hollow region 210 extends along a first direction D1, and the second hollow region 220 extends along a second direction D2, and the first direction D1 is perpendicular to the second direction D2. The first hollow region 210 and the second hollow region 220 are alternately arranged along the first direction D1 and along the second direction D2.

In some embodiments, each of the first hollow regions 210 has two opposite first arc regions 212 and two opposite first sides 214, and the first arc regions 212 are respectively disposed at two ends of the first hollow region 210 along the first direction D1, and the two first sides 214 are respectively disposed between the two first arc regions 212. In some embodiments, the second hollow region 220 has two opposite second arc regions 222 and two opposite second sides 224, and the two second arc regions 222 are respectively disposed at two ends of the second hollow region 220 along the second direction D2, and the two second sides 224 are respectively disposed between the two second arc regions 222. Specifically, the first hollow region 210 extends along the first direction D1 and is surrounded by the first arc region 212, the first side 214, the first arc region 212, and the first side 214 in sequence. The second hollow region 220 extends along the second direction D2 and is surrounded by the second arc region 222, the second side 224, the second arc region 222, and the second side 224 in sequence.

In some embodiments, the first hollow region 210 extends along the first direction D1, and the second hollow region 220 extends along the second direction D2. The first hollow region 210 and the second hollow region 220 are sequentially spaced along the first direction D1, and the first hollow region 210 and the second hollow region 220 are also sequentially spaced along the second direction D2. Specifically, the first arc region 212 of the first hollow region 210 is adjacent to the second side 224 of the second hollow region 220, and there is a bridge region 120 between the first arc region 212 and the second side 224. The second arc region 222 of the second hollow region 220 is adjacent to the first side 214 of the first hollow region 210, and there is a bridge region 120 between the second arc region 222 and the first side 214.

The display units 300 are disposed on the island regions 110 of the substrate 100, respectively. The display unit 300 includes a light emitting diode chip 310, which is only exemplarily drawn in the upper left side in FIG. 1 to make the drawing easy to understand. The light emitting diode chip 310 includes, but is not limited to, quantum dot light emitting diodes (QLED) chips, micro light emitting diode (micro LED) chips, sub-millimeter light emitting diode (mini LED) chips, organic light emitting diode (OLED), etc.

The wire structures 400 are respectively disposed on the bridge regions 120 of the substrate 100, and the wire structures 400 are electrically connected to the display units 300. In some embodiments, the wire structure 400 includes a wire layer 410, and the wire layer 410 includes a wire 412 and a protective layer 414, and the wire 412 is disposed on the first surface 102 of the substrate 100. In some embodiments, the number of the wire 412 may be one or more. When there are a plurality of wires 412, the wires 412 are arranged on the first surface 102 of the substrate 100 at intervals. A material of the wire 412 includes, but is not limited to, titanium/aluminum/titanium (Ti/Al/Ti), aluminum, copper, silver, or alloys thereof. In some embodiments, the protective layer 414 covers the wires 412 and a portion of the first surface 102 of the substrate 100. A material of the protective layer 414 includes, but is not limited to, an organic material such as acrylic, polyimide, polyester, or a combination thereof. The protective layer 414 is mainly used to protect the wire 412 and adjust the stress so that the wire 412 does not break.

The spacer 500 is disposed on and in contact with the first surface 102 of the substrate 100, and the spacers 500 respectively surround the hollow regions 200, and the spacer 500 is separated from the wire structure 400. Specifically, the spacer 500 is directly disposed on the first surface 102 of the substrate 100 and surrounds an outer edge of the hollow region 200. In some embodiments, a bottom corner 510 of the spacer 500 adjacent to the hollow region 200 is an obtuse angle. Specifically, taking the first surface 102 of the substrate 100 as a horizontal plane, there is the obtuse angle between an inclined surface of the bottom corner 510 of the spacer 500 and the horizontal plane, and an angle θ1 is about 105° to about 170°, such as 110°, 120°, 130°, 140°, 150°, 160°, or any value between any two of these values. Taking the second surface 104 of the substrate 100 as a horizontal plane, a top corner 130 of the substrate 100 adjacent to the spacer 500 is also an obtuse angle, and an angle θ2 is about 105° to about 170°, such as 110°, 120°, 130°, 140°, 150°, 160°, or any value between any two of these values. The reason why the bottom corner 510 of the spacer 500 is the obtuse angle and the top corner 130 of the substrate 100 adjacent to the spacer 500 is the obtuse angle is due to the special structure created when the substrate 100 is etched by dry etching. In some embodiments, a material of the spacer 500 is an inorganic material including, but not limited to, silicon dioxide, silicon nitride, titanium dioxide, tantalum pentoxide ($Ta_2O_5$) or a combination thereof. In some embodiments, in a cross-sectional view, a width E of a top of each of the spacers 500 (i.e., before being etched) is between about 1 μm and about 10 μm, for example, about 2 μm, about 3 μm, about 4 μm, about 5 μm, about 6 μm, about 7 μm, about 8 μm, about 9 μm, or any value between any two of these values. The width E of each of the spacers 500 mainly provides the width E sufficient to prevent over etching during the mask 600 patterning, and further to affect the etching of the substrate 100. The pattern of the substrate 100 is defined by the mask 600. Therefore, in the cross-sectional view, the bottom corner 510 of the spacer 500 after etching is the obtuse angle, and the top corner 130 of the substrate 100 adjacent to the spacer 500 is also the obtuse angle.

In some embodiments, a distance L1 between the spacer 500 adjacent to the first side 214 of the first hollow region 210 and the wire structure 400 is smaller than a distance L2 between the spacer 500 adjacent to the first arc region 212 of the first hollow region 210 and the wire structure 400. Specifically, the distance L1 is the shortest distance between the spacer 500 adjace123nt to the first side 214 of the first hollow region 210 and the wire structure 400; the distance L2 is at least the closest distance between the spacer 500 located at an arc top P1 of the first arc region 212 and the wire structure 400. In some embodiments, a distance L3 between the spacer 500 adjacent to the second side 224 of the second hollow region 220 and the wire structure 400 is smaller than a distance L4 between the spacer 500 adjacent to the second arc region 222 of the second hollow region 220 and the wire structure 400. Specifically, the distance L3 is the shortest distance between the spacer 500 adjacent to the second side 224 of the second hollow region 220 and the wire structure 400; the distance L4 is least the closest distance between the spacer 500 located at an arc top P2 of the second arc region 222 and the wire structure 400. When the flexible display panel 10 is bent and stretched, the regions that will bear the strongest stress are the first arc region 212 and the second arc region 222, so the distance L2 and the distance L4 need to be designed to be larger than the distance L1 and the distance L3. In some embodiments, the distance L1, the distance L2, the distance L3, and the distance L4 are designed for different bending stress depending on location of the wire structure 400. For example, when the wire structure 400 is located in the center between the spacer 500 adjacent to the first side 214 and the spacer 500 adjacent to the first arc region 212, the distance L1 is equal to the distance L2 and the distance L3 is equal to the distance L4 (figure not shown).

Figure 3:
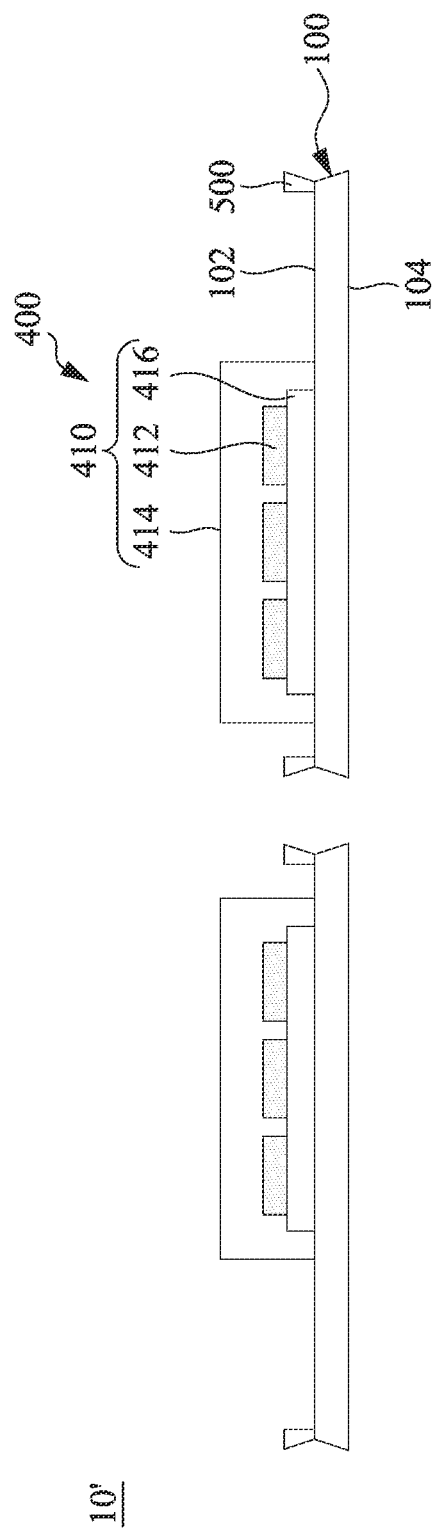
FIG. 3 is a cross-sectional view of a flexible display panel according to other embodiments of the present disclosure.

Please refer to FIG. 3. FIG. 3 is a cross-sectional view of a flexible display panel 10' according to other embodiments of the present disclosure. The difference between FIG. 3 and FIG. 2 is that the wire layer 410 of the wire structure 400 further includes a buffer layer 416 disposed on the first surface 102 of the substrate 100, and the wire 412 is disposed on the buffer layer 416. The buffer layer 416 and the spacer 500 are separated from and not connected to each other. The protective layer 414 covers the wire 412, the buffer layer 416 and a portion of the substrate 100. The protective layer 414 is mainly used to protect the wire 412 and adjust the stress so that the wire 412 does not break, and the buffer layer 416 is used to improve the deposition and crystallization quality of other layers.

In some embodiments, the spacer 500 and the buffer layer 416 are made of a same material, which is an inorganic material including, but not limited to, silicon dioxide, silicon nitride, titanium dioxide, tantalum pentoxide ($Ta_2O_5$) or a combination thereof. That is, the spacer 500 may be formed together with the buffer layer 416, and the spacer 500 and the buffer layer 416 are then separated by etching. As such, when the spacer 500 is stressed and fractured, the crack will not extend to the buffer layer 416 of the wire structure 400 and damage the conductive function of the wire 412 thereon.

Figure 4:
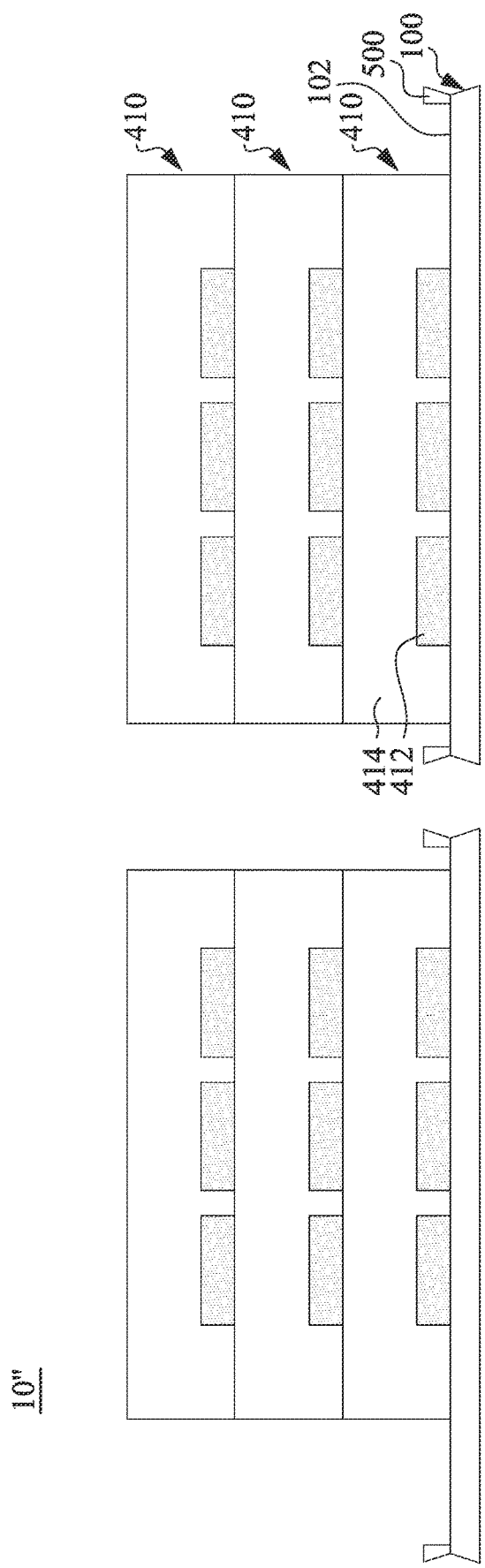
FIG. 4 is a cross-sectional view of a flexible display panel with a plurality of wire layers according to some embodiments of the present disclosure.

Please refer to FIG. 4. FIG. 4 is a cross-sectional view of a flexible display panel 10″ with a plurality of wire layers according to some embodiments of the present disclosure. The difference between FIG. 4 and FIG. 2 is that there are a plurality of wire layers 410 stacked in sequence. In some embodiments, the wire layer 410 includes wires 412 and a protective layer 414, and the wires 412 of the lowermost wire layer 410 are disposed on the substrate 100, and the protective layer 414 covers the wires 412; the wires 412 of the upper wire layer 410 are disposed on the protective layer 414 of the lowermost wire layer 410, and the protective layer 414 of the upper wire layer 410 covers the wires 412 of the upper wire layer 410; the uppermost protective layer 414 is stacked in sequence. The number of the wire layers 410 can be increased or decreased according to requirements, and the number of the layers on both sides can be the same (e.g., as shown in in FIG. 4, there are three layers on the left side and three layers on the right side) or different.

Figure 5:
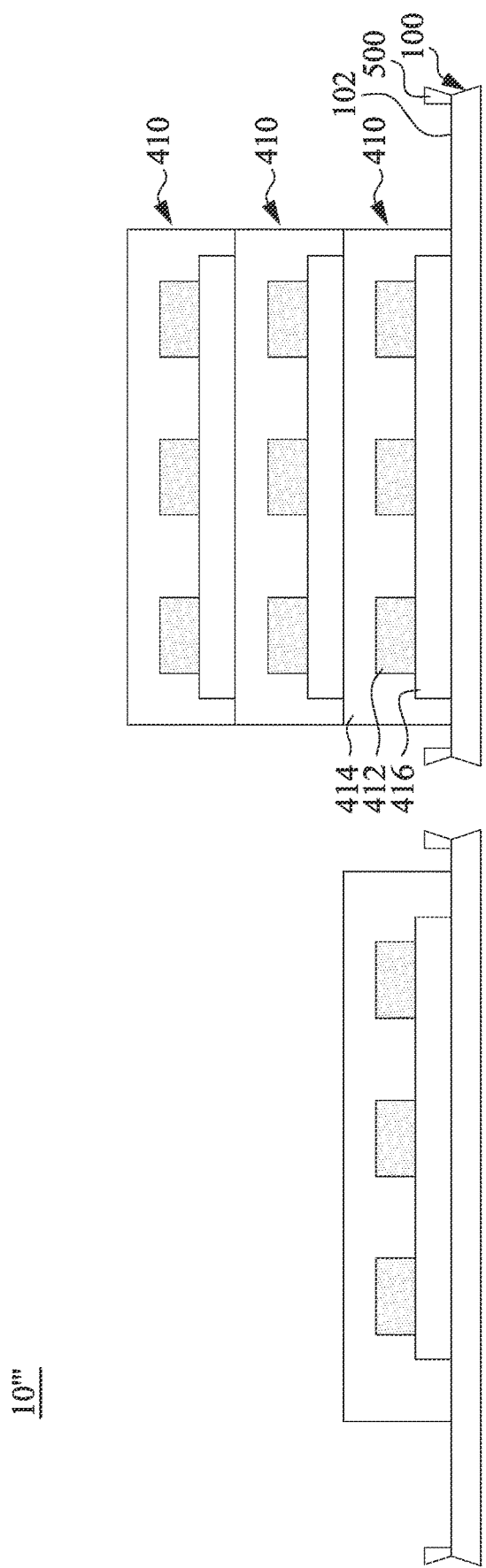
FIG. 5 is a cross-sectional view of a flexible display panel with a plurality of wire layers according to other embodiments of the present disclosure.

Please refer to FIG. 5. FIG. 5 is a cross-sectional view of a flexible display panel 10‴ with a plurality of wire layers according to other embodiments of the present disclosure. The difference between FIG. 5 and FIG. 3 is that there are a plurality of wire layers 410 stacked in sequence. In some embodiments, the wire layer 410 includes wires 412, a protective layer 414 and a buffer layer 416, and the wires 412 are disposed on the buffer layer 416, and the protective layer 414 covers the wires 412 and the buffer layer 416. In some embodiments, the buffer layer 416 disposed on the first surface 102 of the substrate 100 and the spacer 500 are separated from each other. In some embodiments, the substrate 100 is a flexible substrate, and the spacer 500 and one of the buffer layers 416 of the wire layers 410 are made of a same material. That is, the spacer 500 may be formed together with any of the buffer layers 416, and the spacer 500 and the buffer layer 416 are then separated by etching. The number of the wire layers 410 can be increased or decreased according to requirements, and the number of the layers on both sides can be different (e.g., as shown in FIG. 5, there is one layer on the left side and three layers on the right side) or the same.

Figure 6:
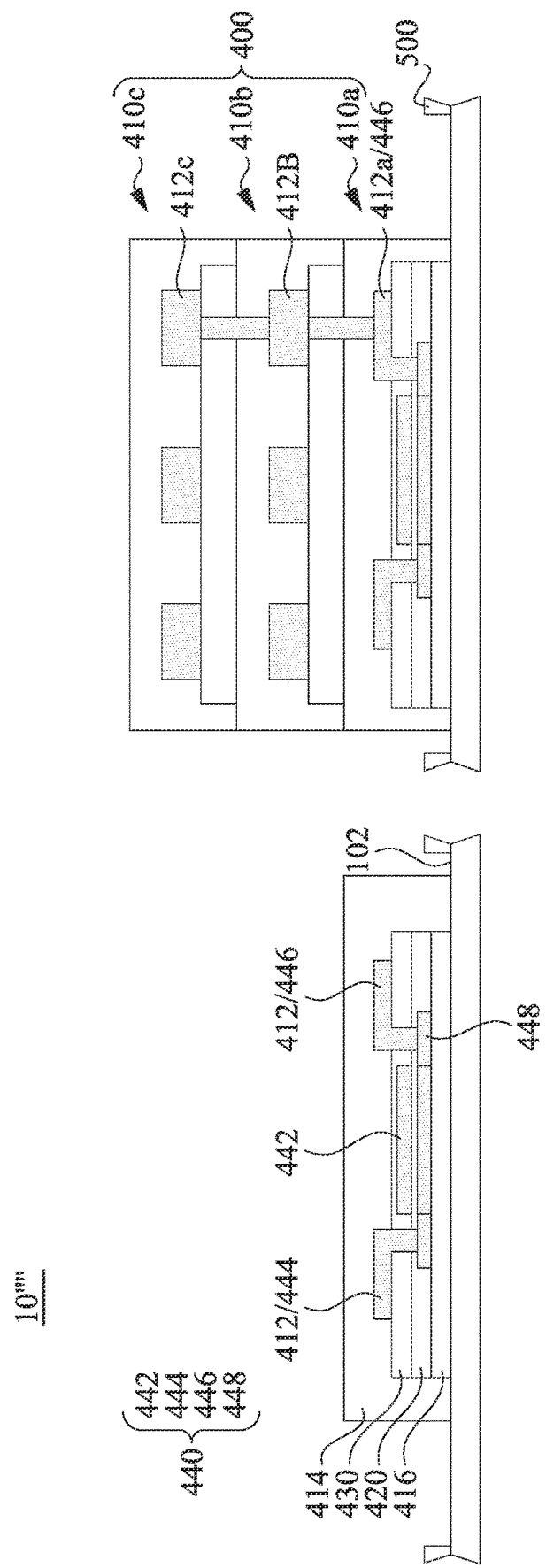
FIG. 6 is a cross-sectional view of a flexible display panel with a plurality of wire layers according to other embodiments of the disclosure.

Please refer to FIG. 6. FIG. 6 is a cross-sectional view of a flexible display panel 10″″ with a plurality of wire layers according to other embodiments of the disclosure. The difference between FIG. 6 and FIG. 5 is that the wire structure 400 further includes a gate insulator (GI) 420, an interlayer dielectric (ILD) layer 430, and a thin film transistor 440. The thin film transistor 440 is disposed on the buffer layer 416 and includes a gate 442, a source 444, a drain 446, and a channel layer 448, but it is not limited thereto. In some embodiments, the wire structure 400 includes the buffer layer 416, the gate insulator 420 and the interlayer dielectric layer 430 sequentially disposed from bottom to top. The gate 442 is disposed on the gate insulator 420 and is embedded by the interlayer dielectric layer 430. The source 444 and the drain 446 are separately disposed on the interlayer dielectric layer 430 and covered by the protective layer 414. The channel layer 448 is disposed on the buffer layer 416 and is covered by the gate insulator 420, and the source 444 and the drain 446 are electrically connected to the channel layer 448. In some embodiments, a wire layer 410*a* including a gate insulator 420, an interlayer dielectric layer 430, and a thin film transistor 440 is disposed on the first surface 102 of the substrate 100, and a wire layer 410*b* is disposed on the protective layer 414 of the wire layer 410*a*, and a wire layer 410*c* is disposed on the protective layer 414 of the wire layer 410*b*. The wire 412*a* of the wire layer 410*a* is a source 444 or a drain 446, and the wire 412*b* of the wire layer 410*b* is electrically connected to the wire 412*a*, and the wire 412*c* of the wire layer 410*c* is electrically connected to the wire 412*b*.

Figure 7:
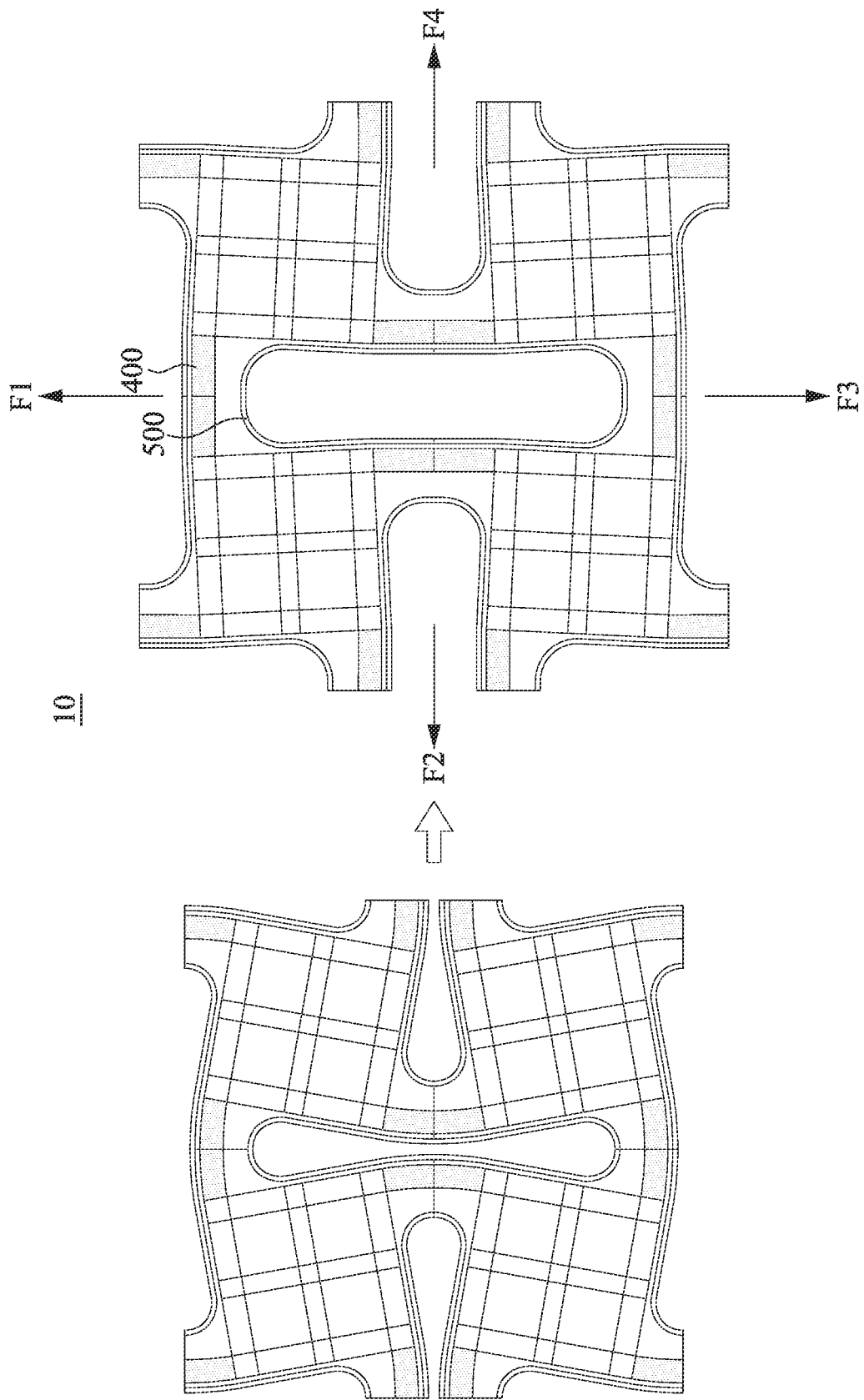
FIG. 7 is a schematic diagram of a use state of a flexible display panel according to some embodiments of the present disclosure.

FIG. 7 is a schematic diagram of a use state of a flexible display panel according to some embodiments of the present disclosure. When the flexible display panel 10 is stretched by forces in different directions, such as the force F1, the force F2, the force F3, and the force F4 perpendicular to each other in sequence, it can be seen that the bridge region 120 of the substrate 100 receives the greatest stress and thus is bent and stretched, as shown on the right side of FIG. 7. At this time, since the spacer 500 is isolated from the wire structure 400, even if the spacer 500 is broken due to stress, it only reaches the spacer 500 itself, and does not break and extend to the wire structure 400. Since the substrate 100 is the flexible substrate, it can withstand bending and stretching caused by the stress.

Figure 8:
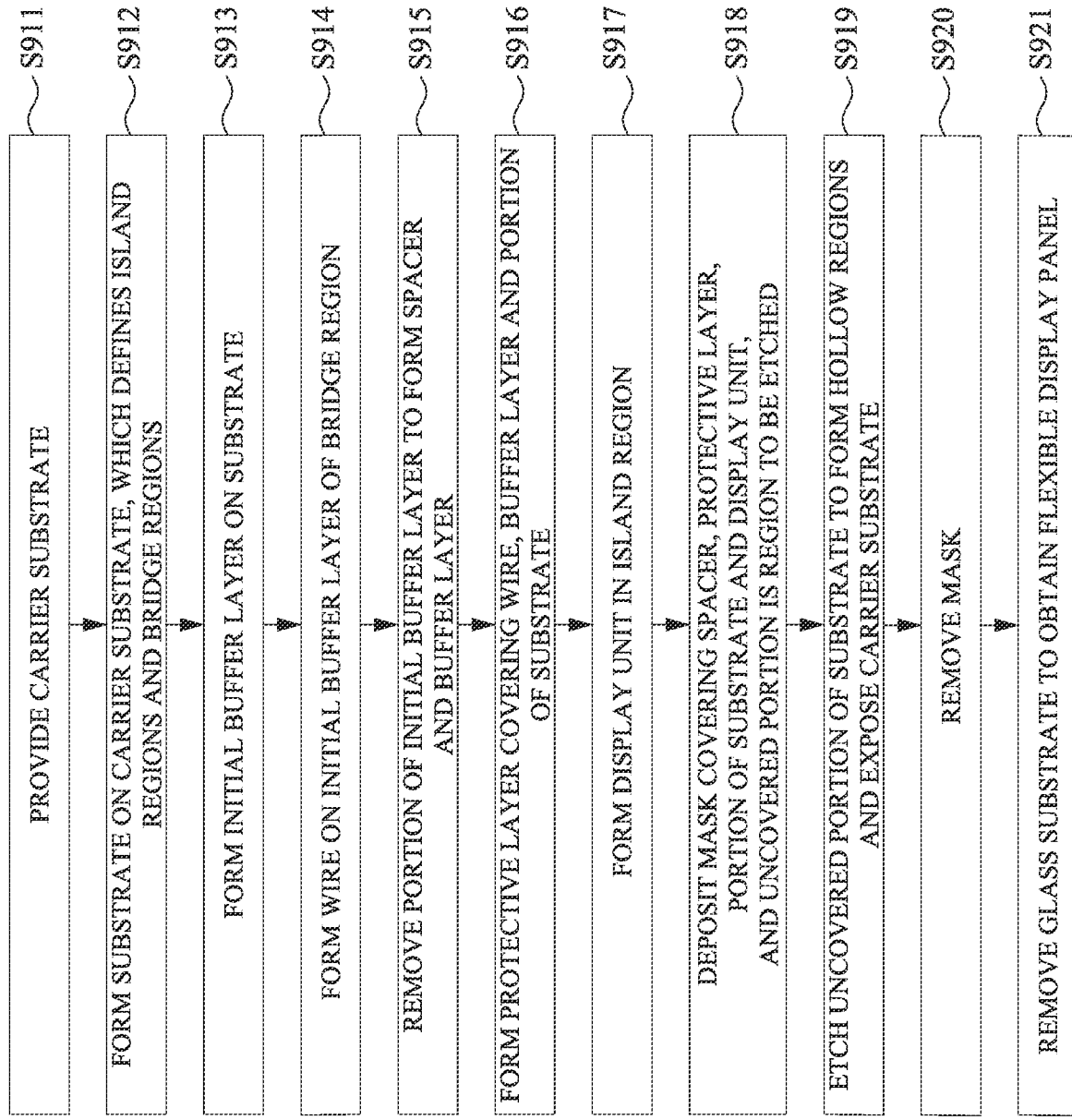
FIG. 8 is a flowchart of a method of manufacturing a flexible display panel according to some embodiments of the present disclosure.

FIG. 8 is a flowchart of a method of manufacturing a flexible display panel according to some embodiments of the present disclosure. The method 900 starts at step S911 that a carrier substrate is provided. The method 900 then proceeds to step S912 that a substrate 100 is formed on the carrier substrate, which defines a plurality of island regions 110 and a plurality of bridge regions 120. The method 900 then proceeds to step S913 that an initial buffer layer is formed on the substrate 100. The method 900 then proceeds to step S914 that a wire 412 is formed on the initial buffer layer of the bridge region 120. The method 900 then proceeds to step S915 that a portion of the initial buffer layer is removed to form a spacer 500 and a buffer layer 416. The method 900 then proceeds to step S916 that a protective layer 414 is formed covering the wire 412, the buffer layer 416, and a portion of the substrate 100. The method 900 then proceeds to step S917 that a display unit 300 is formed in the island region 110. The method 900 then proceeds to step S918 that a mask 600 is deposited covering the spacer 500, the protective layer 414, a portion of the substrate 100 and the display unit 300, and an uncovered portion of the substrate 100 is a region to be etched. The method 900 then proceeds to step S919 that the uncovered portion of the substrate 100 is etched to form a plurality of hollow regions 200 and expose the carrier substrate. The method 900 then proceeds to step S920 that the mask 600 is removed. Finally, the method 900 proceeds to step S921 that the carrier substrate is removed, and the flexible display panel 100 is obtained.

Please refer to FIG. 9. FIG. 9 to FIG. 13 are schematic cross-sectional views of a method of manufacturing a flexible display panel at various stages according to some embodiments of the present disclosure. FIGS. 9 to 13 only illustrate part of the steps for the bridge region 120 located in the substrate 100, and the manufacturing process of the island region 110 of the substrate 100 is omitted and not shown. FIG. 9 is drawn according to step S916 of FIG. 8. In step S916, the protective layer 414 is formed covering the wire 412, the buffer layer 416, and the portion of the substrate 100.

Figure 11:
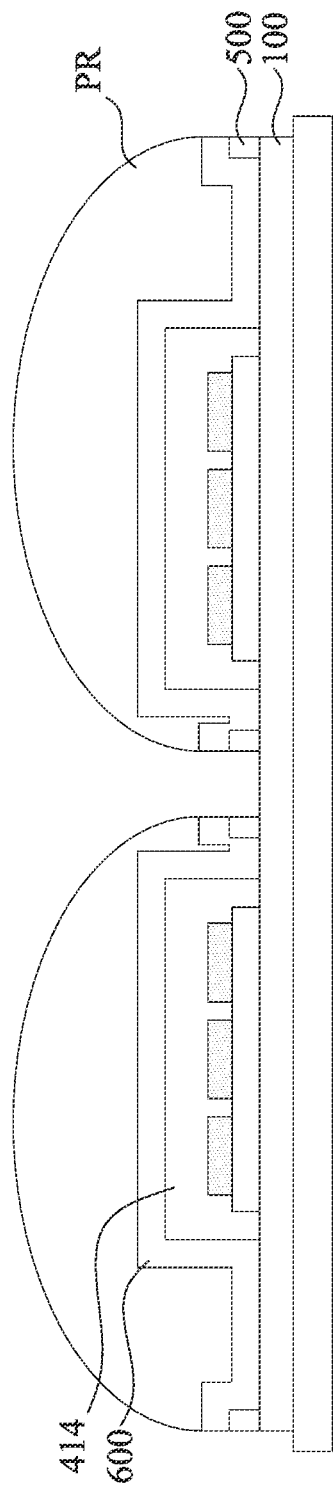

FIGS. 9 to 11 are drawn according to step S918 of FIG. 8. In step S918, the mask 600 is deposited covering the spacer 500, the protective layer 414, and the portion of the substrate 100, and the uncovered portion of the substrate 100 is a region to be etched. Specifically, since the substrate 100 is the flexible substrate and made of polyimide, a hard mask is required as an etching method for patterning the polyimide. This is because it is considered that if the hard mask material is made of silicon oxide or silicon nitride, the structure of the display unit 300 may be damaged when etched using hydrofluoric acid (HF), and the same problem will occur even if dry etching is used. Therefore, the hard mask of the present disclosure selects metal oxide as the mask 600 (e.g., indium gallium zinc oxide (IGZO), indium tin zinc oxide (IZTO), etc.) to cover the spacer 500, the protective layer 414 and the substrate 100 (as shown in FIG. 10). Next, photolithography (PR) is used to define the region to be etched, and the mask 600 is etched using oxalic acid (as shown in FIG. 11) to form a patterned mask 600 (as shown in FIG. 12). However, since sizing may occur during oxalic acid etching, the spacer 500 is selected as a barrier layer to be disposed on and in contact with the substrate 100 and surrounding the hollow region 200 (as shown in FIG. 13) to avoid the problem of sizing caused by too fast etching rate of the mask 600 on the polyimide, and thus to effectively control the etching size. In some embodiments, the mask 600 covers the spacer 500, and a side 601 of the mask 600 is aligned or coplanar with a side 501 of the spacer 500 to facilitate subsequent improvement of the etching accuracy. In some embodiments, the method of forming or depositing the mask 600 may include, but is not limited to, chemical vapor deposition, physical vapor deposition, plasma-enhanced chemical vapor deposition (PECVD), atomic layer deposition, electroplating or other suitable processes and/or a combination thereof.

FIG. 12 is drawn according to step S919 and step S920 of FIG. 8. In step S919, the uncovered portion of the substrate 100 is etched to form the hollow regions 200 and expose the carrier substrate; in step S920, the mask 600 is removed. Specifically, the patterned mask 600 is used as a barrier layer to define the etched region of the substrate 100, and the substrate 100 is etched by dry etching. At the same time, the bottom corner 510 of the etched spacer 500 adjacent to of the hollow region 200 forms the obtuse angle, and the top corner 130 of the substrate 100 adjacent to the spacer 500 also forms the obtuse angle.

In some embodiments of the present disclosure, the flexible display panel is provided, and the spacer is disposed on and in contact with the substrate and surrounding the hollow region to avoid the problem of difficult control of the mask etching rate and thus to control the etching size.

Although the present disclosure has been disclosed in the above embodiments, it is not intended to limit the present disclosure. Anyone familiar with this technique can make various changes and modifications without departing from the spirit and scope of the present disclosure. The scope of protection of the present disclosure shall be subject to the scope of appended claims.

What is claimed is:

1. A flexible display panel, comprising:
   a substrate, comprising a first surface and defined as:
      a plurality of island regions separated from each other; and
      a plurality of bridge regions respectively connected to two adjacent of the plurality of island regions;
   a plurality of hollow regions, each of the plurality of hollow regions surrounded by four adjacent of the plurality of island regions and four adjacent of the plurality of bridge regions;
   a plurality of display units respectively disposed on the plurality of island regions of the substrate;
   a plurality of wire structures respectively disposed on the plurality of bridge regions of the substrate and electrically connected to the plurality of display units, wherein each of the plurality of wire structures comprises at least one wire layer, and the at least one wire layer comprises:
      at least one wire disposed on the first surface of the substrate, and
      a buffer layer disposed on the first surface, and the at least one wire disposed on the buffer layer; and
   a plurality of spacers disposed on and in contact with the first surface of the substrate, respectively surrounding the plurality of hollow regions, and separated from the wire structures,
   wherein the buffer layer and the plurality of spacers are separated from each other,
   wherein the substrate is a flexible substrate, and the plurality of spacers and the buffer layer are made of a same material.

2. The flexible display panel of claim 1, wherein each of the plurality of wire structures further comprises a protective layer covering the at least one wire, the buffer layer, and a portion of the substrate.

3. The flexible display panel of claim 1, wherein the plurality of spacers are made of an inorganic material.

4. The flexible display panel of claim 1, wherein a bottom corner of each of the plurality of spacers adjacent to each of the plurality of hollow regions is an obtuse angle.

5. The flexible display panel of claim 1, wherein the plurality of hollow regions are composed of a plurality of first hollow regions and a plurality of second hollow regions, wherein each of the plurality of first hollow regions extends along a first direction, and each of the plurality of second hollow regions extends along a second direction, and the first direction is perpendicular to the second direction; the plurality of first hollow regions and the plurality of second hollow regions are alternately arranged along the first direction and along the second direction.

6. The flexible display panel of claim 5, wherein each of the plurality of first hollow regions has two opposite first arc regions and two opposite first sides, and the first arc regions are respectively disposed at two ends of each of the plurality of first hollow regions along the first direction, and the first sides are respectively disposed between the first arc regions;
   wherein a distance between each of the plurality of spacers adjacent to the first sides of each of the plurality of first hollow regions and each of the plurality of wire structures is smaller than a distance between each of the plurality of spacers adjacent to the first arc regions of each of the plurality of first hollow regions and each of the plurality of wire structures.

7. The flexible display panel of claim 5, wherein each of the plurality of second hollow regions has two opposite second arc regions and two opposite second sides, and the second arc regions are respectively disposed at two ends of each of the plurality of second hollow regions along the second direction, and the second sides are respectively disposed between the second arc regions;
   wherein a distance between each of the plurality of spacers adjacent to the second sides of each of the plurality of second hollow regions and each of the plurality of wire structures is smaller than a distance between each of the plurality of spacers adjacent to the second arc regions of each of the plurality of second hollow regions and each of the plurality of wire structures.

8. The flexible display panel of claim 1, wherein a number of the at least one wire layer is a plurality of wire layers, and the plurality of wire layers are stacked in sequence.

9. The flexible display panel of claim 8,
wherein each of the plurality of wire layers further comprises a buffer layer and a protective layer, and the at least one wire of each of the plurality of wire layers is respectively disposed on each of the buffer layers, and each of the protective layers respectively covers the at least one wire and each of the buffer layers of each of the plurality of wire layers,
wherein the buffer layer disposed on the first surface of the substrate and the plurality of spacers are separated from each other.

10. The flexible display panel of claim 9, wherein the substrate is a flexible substrate, and the plurality of spacers and one of the buffer layers of the plurality of wire layers are made of a same material.

11. The flexible display panel of claim 1, wherein each of the plurality of wire structures further comprises at least one thin film transistor electrically connected to the at least one wire.

12. The flexible display panel of claim 1, wherein a number of the at least one wire is a plurality of wires, and the plurality of wires are disposed on the first surface of the substrate at intervals in sequence.

13. The flexible display panel of claim 1, wherein each one of the plurality of display unit comprises a light emitting diode chip.

* * * * *